(12) United States Patent
Watanabe

(10) Patent No.: US 6,825,473 B2
(45) Date of Patent: Nov. 30, 2004

(54) RADIATION DETECTING APPARATUS, METHODS OF PRODUCING APPARATUS, AND RADIOGRAPHIC IMAGING SYSTEM

(75) Inventor: Minoru Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 09/983,434

(22) Filed: Oct. 24, 2001

(65) Prior Publication Data

US 2002/0074503 A1 Jun. 20, 2002

(30) Foreign Application Priority Data

Oct. 26, 2000 (JP) ........................................ 2000-327193
Dec. 12, 2000 (JP) ........................................ 2000-377711
Oct. 22, 2001 (JP) ........................................ 2001-323609

(51) Int. Cl.$^7$ ............................................... G01T 1/24
(52) U.S. Cl. ........................... 250/370.09; 250/370.01; 250/336.1; 250/370.08; 250/338.4
(58) Field of Search ..................... 250/370.09, 370.01, 250/336.1, 370.08, 338.4

(56) References Cited

U.S. PATENT DOCUMENTS 6,242,746 B1 * 6/2001 Teranuma et al. ...... 250/370.13

FOREIGN PATENT DOCUMENTS

JP 2000-156487 6/2000

* cited by examiner

Primary Examiner—David Porta
Assistant Examiner—Christine Sung
(74) Attorney, Agent, or Firm—Fitzpatrick, Cella, Harper & Scinto

(57) ABSTRACT

A radiation detecting apparatus has a first substrate provided with a converter for converting radiations to charge and a second substrate provided with a processor for processing the charge transferred from the first substrate, and the first substrate is bonded through a transfer member for transferring the charge, to the second substrate. In the radiation detecting apparatus, a film for maintaining electrical insulation between adjacent pixels is formed so as to cover the circumference of the transfer member placed between the first and second substrates, and the film controls a clearance between the first and second substrates.

11 Claims, 13 Drawing Sheets

AN EXTERNAL APPEARANCE OF BONDING SINGLE CRYSTALLINE SEMICONDUCTOR SUBSTRATE ON TFT MATRIX PANEL

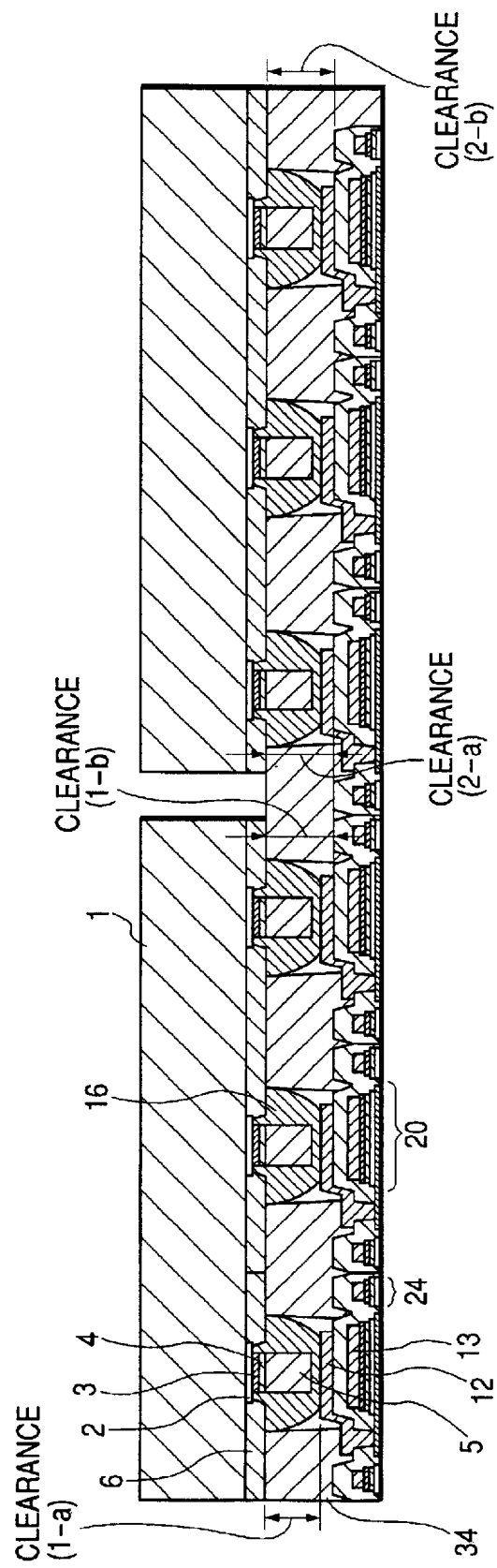

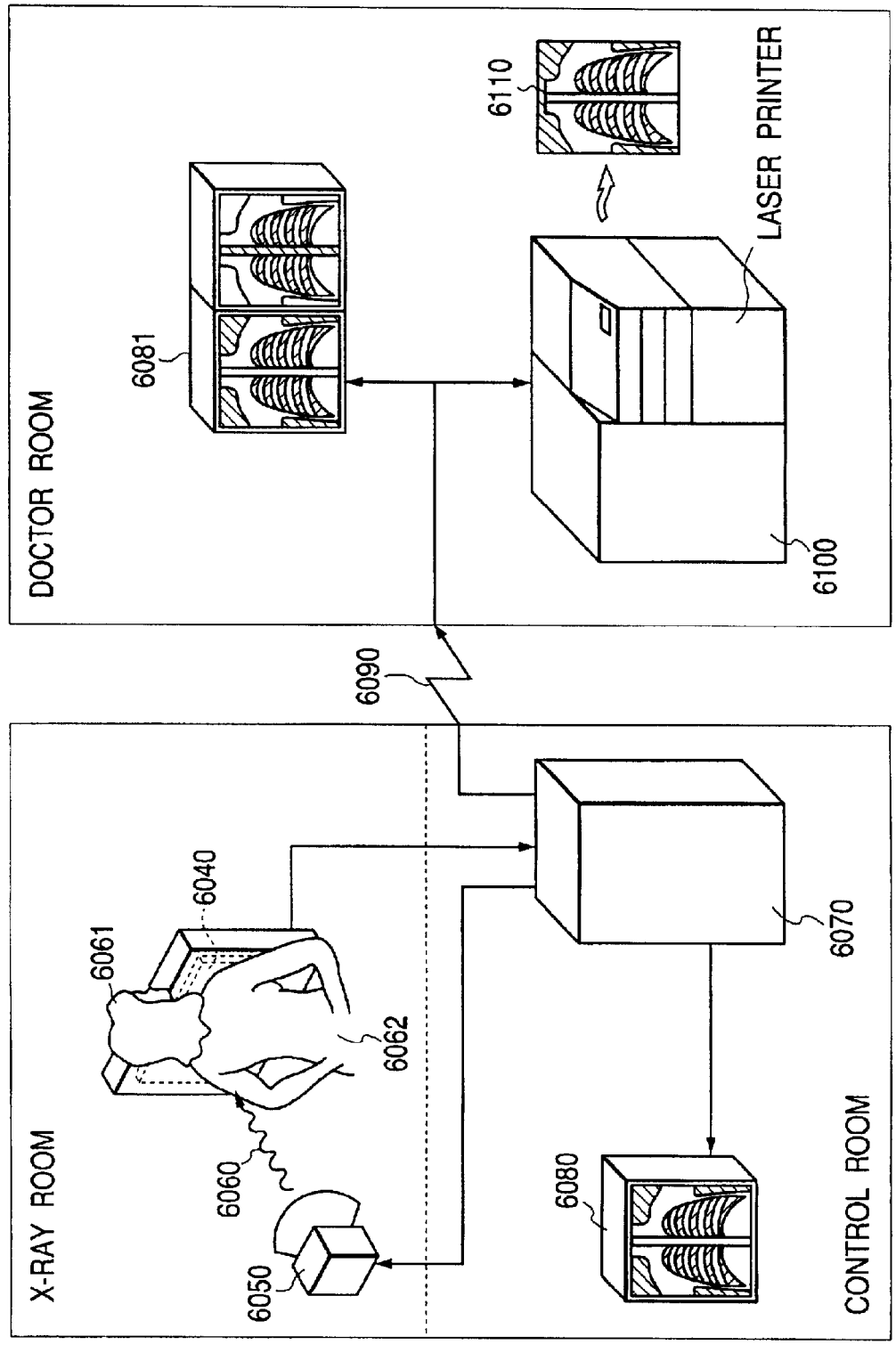

RADIATION DETECTING APPARATUS, METHODS OF PRODUCING APPARATUS, AND RADIOGRAPHIC IMAGING SYSTEM

BACKGROUND OF THE INVENTION

1. Field of the Invention

The present invention relates generally to radiation detecting apparatus, methods of producing the apparatus, and a radiographic imaging system and, more particularly, to radiation detecting apparatus for medical use or for nondestructive inspection, methods of producing the apparatus, and a radiographic imaging system incorporating the apparatus.

In the present specification the description will be given on the assumption that radiations embrace all radiations including X-rays, $\alpha$ rays, $\beta$ rays, $\gamma$ rays, and so on.

2. Related Background Art

In recent years, imagery is quickly changing from analog images to digital images in the X-ray roentgenologic fields of medical equipment. The digital images allow image processing, which can enhance diagnostic accuracy. Since there is no need for development, radiographic intervals can be shortened and thus radiography can be efficiently performed in group examination and the like.

Requirements in such fields are improvement in detection sensitivity and reduction in noise of signal. Particularly, the improvement in detection sensitivity will result in decreasing X-ray exposure doses during radiography and, in turn, reducing influence on human bodies, so that there are increasing demands for development of X-ray detecting apparatus with high sensitivity.

Technologies necessary for enhancement of sensitivity of X-ray detectors include the following.

(1) Increase in absorption efficiency of X-ray absorbing material (2) Increase in volume of X-ray absorbing portion (3) Increase in transfer efficiency of carriers generated in the X-ray absorbing portion For the increase in the absorption efficiency of the X-ray absorber, attention is being focused on employment of monocrystalline semiconductors such as compound semiconductors and the like. The monocrystalline compound semiconductors have high efficiency of utilization of detected X-rays, because they can produce carriers without conversion to light upon direct absorption of X-rays. Recently, development is under way to develop X-ray detectors with a large area, particularly, sensors associated with the roentgenographic fields, by coupling a monocrystalline semiconductor substrate to a TFT matrix panel.

However, when an area sensor to detect X-rays is fabricated in such structure that TFT portions, transfer lines, etc., together with X-ray sensors, are integrated in a monocrystalline semiconductor being an X-ray absorbing material, absorption of X-rays causes variation in noise and/or capacitances and also causes leakage or the like of TFTs, thus making it difficult to implement the area sensor at a level of practical use. It is thus desirable to produce the monocrystalline semiconductor substrate for detecting X-rays and a substrate having other components of TFT portions and others using a-Si with little absorption of X-rays, separately from each other. After the two substrates are produced separately, they are bonded to each other and on that occasion electrical connection needs to be established at every pixel, however, this makes it difficult to maintain electrical insulation between adjacent pixels in implementation of high-definition radiation detecting apparatus. It is, therefore, an object of the present invention to provide radiation detecting apparatus constructed so as to establish excellent, electrical connection at every pixel and maintain electrical insulation between adjacent pixels on the occasion of bonding the TFT matrix panel side to the monocrystalline semiconductor substrate side.

SUMMARY OF THE INVENTION

In order to accomplish the above object, the present invention provides a radiation detecting apparatus in which a first substrate comprising converting means for converting a radiation to charge is bonded through a transfer member for transferring the charge, to a second substrate comprising processing means for processing the charge transferred from the first substrate, wherein an organic film is formed so as to cover a circumference of the transfer member placed between the first and second substrates.

Further, each of the first and second substrates is provided with a passivation film, and the organic film is provided so as to contact each said passivation film, so as to enable bonding without clearance, which is preferable in terms of height adjustment or protection. Moreover, when the first and/or the second substrate is divided into plural segments, the apparatus can be fabricated at good yields, and this structure also facilitates height adjustment during bonding, which is preferable.

The above object is also accomplished by a radiation detecting apparatus having a first substrate comprising means for converting a radiation to charge and a second substrate having a plurality of pixels formed in a matrix pattern, said first substrate and second substrate being electrically connected to each other, wherein a passivation film is provided at least on a surface of the first substrate on the side where the first substrate is connected to the second substrate, an electroconductive adhesive is provided corresponding to the pixels, and on the occasion of coupling the first and second substrates through the electroconductive adhesive to each other, the passivation film is disposed so as to prevent the electroconductive adhesive from establishing electrical conduction between adjacent pixels.

A production method of radiation detecting apparatus according to the present invention comprises a step of forming a passivation film on a first substrate comprising converting means for converting a radiation to charge, a step of forming a passivation film on a second substrate comprising processing means for processing the charge transferred from the first substrate, and a step of placing an organic film on the passivation film formed on the first or second substrate.

Further, a radiographic imaging system according to the present invention comprises the aforementioned radiation detecting apparatus, signal processing means for processing a signal from the radiation detecting apparatus, recording means for recording a signal from the signal processing means, display means for displaying a signal from the signal processing means, transmission processing means for transmitting a signal from the signal processing means, and a radiation generating source for generating the radiation.

The details will be described in embodiments below.

BRIEF DESCRIPTION OF THE DRAWINGS

FIG. 15 is a cross-sectional view along line 15—15 in FIG. 14; and

FIG. 16 is a schematic diagram showing a configuration of an X-ray diagnosis system in Embodiment 6.

DETAILED DESCRIPTION OF THE PREFERRED EMBODIMENTS

The embodiments of the present invention will be described below with reference to the drawings.

Figure 1:
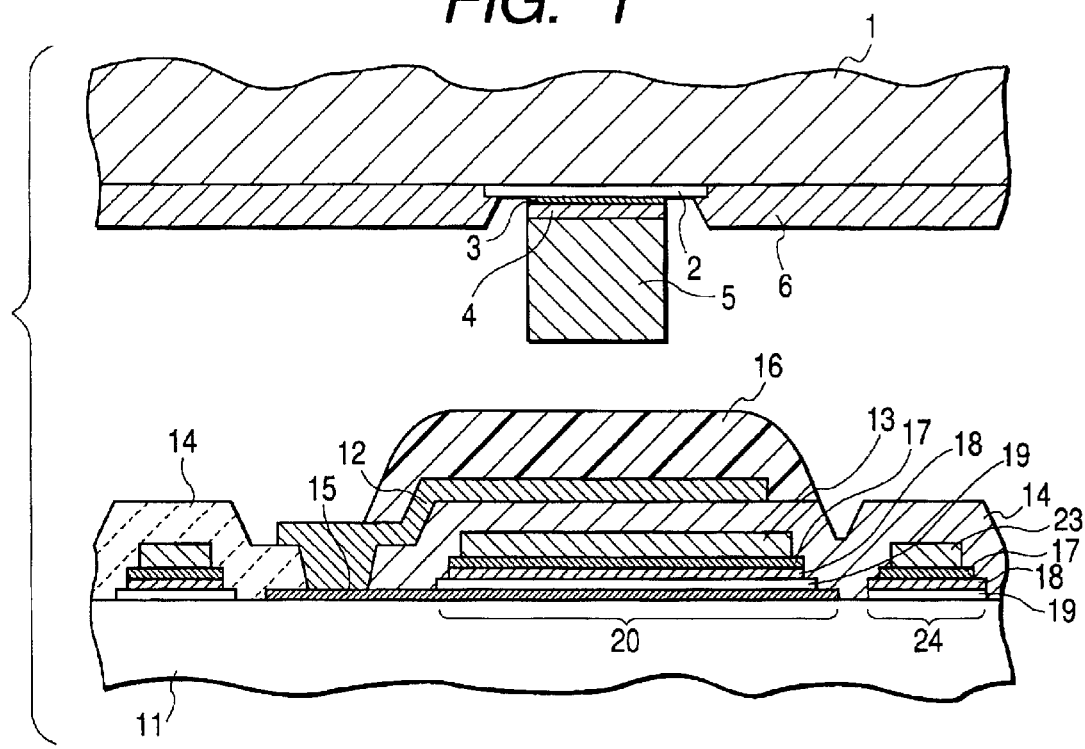
FIG. 1 is a schematic, cross-sectional view of one pixel in the X-ray detecting apparatus before bonding a single crystalline substrate with an insulating substrate of Embodiment 1.

FIG. 1 is a cross-sectional view showing a configuration of the first embodiment of the radiation detecting apparatus according to the present invention. FIG. 1 shows a across section of connecting portions in a state where a patterned pixel on a monocrystalline semiconductor substrate is about to be connected to a pixel consisting of a TFT portion and a capacitor portion on an insulating substrate with an electroconductive adhesive at every pixel. In FIG. 1, first, GaAs is used for the monocrystalline semiconductor substrate 1. For the monocrystalline semiconductor substrate 1, it is also possible to use CdTe, CdZnTe, or the like, in addition to GaAs. A semiconductor layer of p-layer (not shown) is formed on a surface (on the upper side in the figure) of the monocrystalline semiconductor substrate 1, and an Al film (not shown) is formed thereon. A bias voltage is applied to this Al film to deplete the GaAs layer, thereby making it serve as an X-ray detecting portion.

A connection metal 2 is formed through a semiconductor layer of n-layer (not shown) on the back surface (on the lower side in the figure) of the monocrystalline semiconductor substrate 1. This semiconductor layer of n-layer acts as a carrier injection inhibiting layer. In this case, the connection metal 2 is patterned at every pixel on the monocrystalline semiconductor substrate 1, and this patterned portion on the monocrystalline semiconductor substrate 1 works as a sensor portion 7 for detecting X-rays. The connection metal 2 formed on the monocrystalline semiconductor substrate 1 functions to extract electrons generated in the sensor portion 7 and is an Al film deposited by sputtering. The thickness of the Al film is 1.0 µm. The connection metal film 2 may also be deposited by resistance heating evaporation, electron beam evaporation, or the like. The material of the connection metal film 2 may be either selected from chromium, molybdenum, tantalum, titanium, copper, etc., as well as Al.

Barrier metal 3 and barrier metal 4 are deposited on the connection metal 2 on the monocrystalline semiconductor substrate 1 and bump metal 5 is further formed in a downwardly projecting state on the barrier metal 4. The bump metal 5 is used for electrical connection with the insulating substrate 11 through electroconductive adhesive 16, as described hereinafter. Since it is necessary to provide a passivation film on the bonding surface of the semiconductor substrate, as described below, it is preferable to implement the connection by providing a bump as a slightly projecting portion from the bonding surface of the semiconductor substrate. The barrier metal 3 is Ti and the barrier metal 4 Pd, and they are deposited each by sputtering. The bump metal 5 is Au and is deposited by electroplating.

Here the barrier metal 3 is deposited on the connection metal 2 in order to provide good adhesion and electrical conduction to the connection metal 2 and the barrier metal 4 is deposited in order to provide good adhesion and electrical conduction to the bump metal 5. The thickness of the barrier metal (Ti film) 3 is 0.3 µm, the thickness of the barrier metal (Pd film) 4 0.2 µm, and the thickness of the bump metal (Au film) 5 15 µm. In this case, after the Au film is patterned by photolithography, the Pd film and Ti film are successively etched using the Au film as a mask. Passi.SIN 6 is a protective film. Passi.SIN 6 also has the action for maintaining electrical insulation to adjacent pixels. Particularly, with decrease in pixel pitch for higher definition, this problem will become more serious, and thus the provision of such passivation film will be effective.

Figure 2:
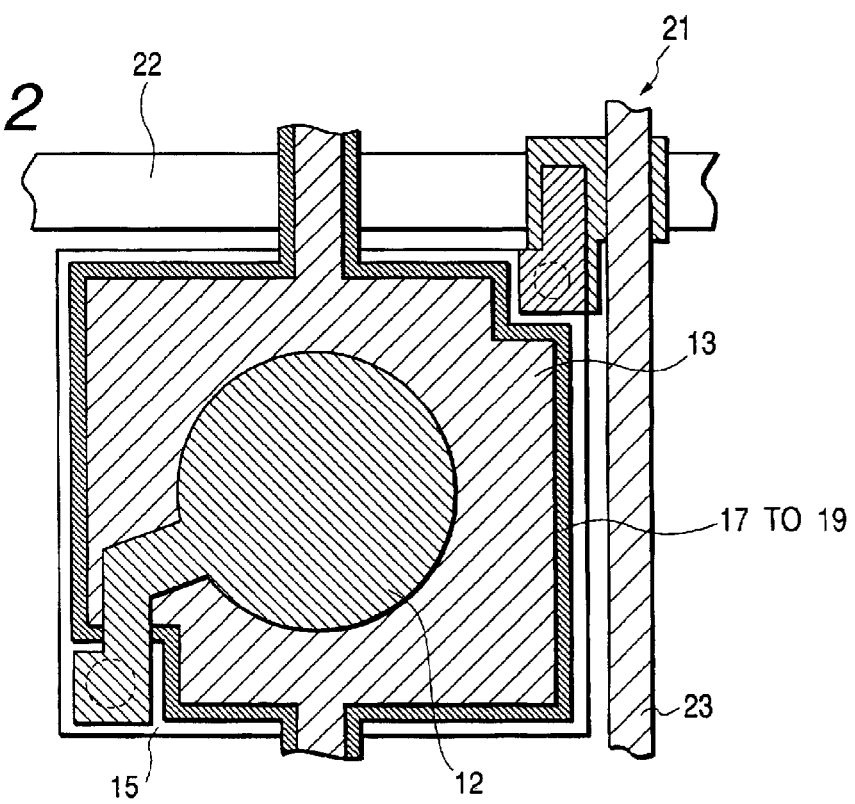
FIG. 2 is a plan view near a capacitor portion 20 of the insulating substrate side in Embodiment 1.

On the other hand, a capacitor portion 20 and a TFT portion (thin film transistor) 21 are formed on the insulating substrate 11. The TFT portion 21 is not shown in FIG. 1, but is formed at a corner of the capacitor portion 20, as shown in FIG. 2. The capacitor portion 20 is provided with n+ layer 17, i-layer 18, and SiN layer (insulating film) 19 between electrode 13 and electrode 15, and these three layers constitute the capacitor portion 20. The TFT portion 21 is also composed of three layers, n+ layer 17, i-layer 18, and SiN layer 19, as the capacitor portion 20 was. Each of the layers in the capacitor portion 20 and in the TFT portion 21 is simultaneously formed and thus they are fabricated in the same process. Numeral 24 designates a signal line portion, which is connected to the TFT portion 21.

Passi.SIN (protective film) 14 is formed on the capacitor portion 20 and on the signal line portion 24, and a connection metal 12 is formed through the protective film 14 above the capacitor portion 20. The connection metal 12 is an Al film deposited by sputtering and is coupled to the electrode 15 of the capacitor portion 20. The thickness of the Al film is 1.0 µm and the Al film is patterned by photolithography so as to be isolated. The connection metal 12 is connected to the bump metal 5 on the monocrystalline semiconductor substrate 1 with electroconductive adhesive 16. The connection metal 12 may also be deposited by resistance heating evaporation, electron beam evaporation, or the like as the connection metal 2 may, and the material of the connection metal 12 may be either selected from chromium, molybdenum, tantalum, titanium, copper, etc., as well as Al.

Although in FIG. 1 the conductive adhesive 16 and the bump metal 5 on the monocrystalline semiconductor substrate 1 are illustrated in a separate state, the two substrates will be laid on each other and the conductive adhesive 16 will be thermally hardened as detailed hereinafter, thereby coupling the monocrystalline semiconductor substrate 1 and the insulating substrate 11 to each other. X-rays absorbed in the monocrystalline semiconductor substrate 1 are converted to electrons and holes and the converted electrons are drawn from the bump metal 5 through the conductive adhesive 16 into the connection metal 12. These electrons are guided through the connection metal 12 to be stored in the capacitor portion 20 formed on the insulating substrate 11, and a charge stored in the capacitor portion 20 is transferred through driving of the TFT portion 21. In this way, the charge converted from radiations is processed and controlled.

Here the electroconductive adhesive 16 is one in which silver particles of 5 to 40 μm are dispersed in a thermosetting epoxy adhesive and is printed by printing at every pixel on the insulating substrate 11 on the occasion of bonding. The conductive adhesive 16 may be either of acrylic adhesives, as well as the epoxy adhesives. A pressing process under high pressure is employed for establishing the electrical connection between the bump metal 5 on the monocrystalline semiconductor substrate 1 and the connection metal 12 on the insulating substrate 11. On this occasion, in order to achieve uniform electrical junction between the monocrystalline semiconductor substrate 1 and the insulating substrate 11, the conductive adhesive 16 is squeezed 30 to 80% heightwise, thereby reducing influence of height variations occurring during the printing of conductive adhesive 16.

During the connection between the monocrystalline semiconductor substrate 1 and the insulating substrate 11, alignment is first achieved and thereafter the printed conductive adhesive 16 is brought into contact with the bump metal 5. Then the two substrates are electrically connected by a process of pressing the two substrates 1, 11 against each other and thereafter thermally hardening the conductive adhesive 16. The pressing work is carried out under the pressure of 2 kg/cm² by a press machine, so as to implement connection through the conductive adhesive 16 at every pixel. In the heat hardening process, the adhesive is heated at the temperature of 140° C. for 60 minutes. The conductive adhesive 16 may be printed on the bump metal 5 on the monocrystalline semiconductor substrate 1 or may be printed on the both semiconductor substrate 1 and insulating substrate 11.

FIG. 2 is a plan view showing a configuration of one pixel in which the TFT portion 21 and capacitor portion 20 are placed on the insulating substrate 11. The size of the pixel is 160 μm square and the connection metal 12 is formed in the circular shape of φ60 μm and in the center of capacitor portion 20. The semiconductor layers of the TFT portion 21 consist of the three layers of insulating film 19, i-layer 18, and n⁺ layer 17, as described above, and the capacitor portion 20 also consist of the three layers of insulating film 19, i-layer 18, and n⁺ layer 17 similarly. The electrodes 13, 15 represent upper and lower electrodes of the capacitor portion 20, numeral 22 a gate line of the TFT portion 21, 23 the signal line of the TFT portion 21, and numerals 17 to 19 the respective layers of the capacitor portion 20.

Figure 3:
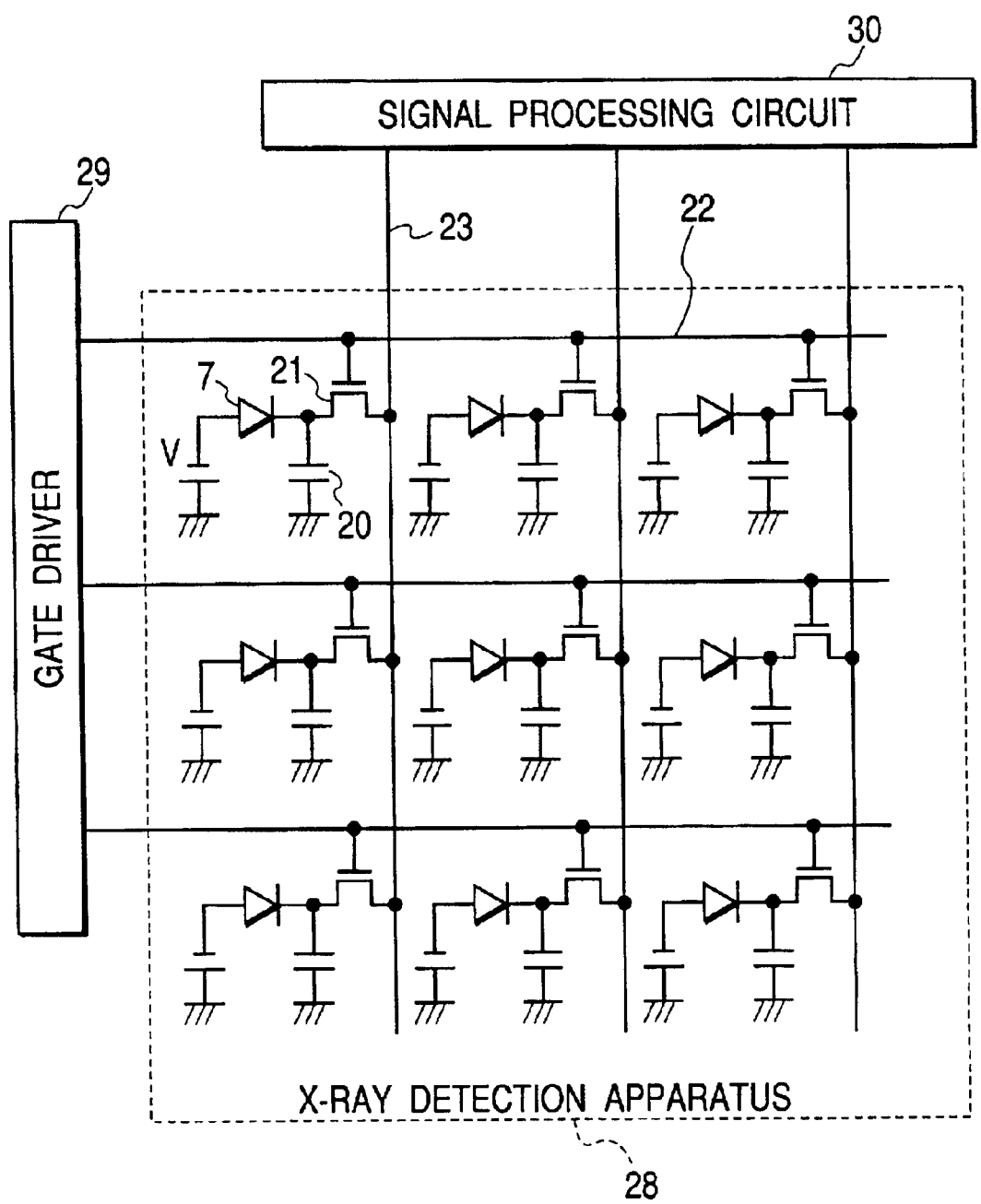
FIG. 3 is a diagram showing an equivalent circuit of the X-ray detecting apparatus in Embodiment 1.

FIG. 3 is a circuit diagram showing an equivalent circuit of the X-ray detecting apparatus of the present embodiment.

In FIG. 3, sensor portions 7 are X-ray detecting sensors formed on the monocrystalline semiconductor substrate 1, as described above, and incident X-rays are absorbed in the sensor portions 7 to generate electrons. Numeral 20 denotes capacitor portions for accumulation of charge formed on the insulating substrate 11, and numeral 21 TFT portions for transfer of charge. The sensor portion 7, capacitor portion 20, and TFT portion 21 constitute one pixel, and a number of pixels are arrayed in a matrix pattern to compose the X-ray detecting apparatus 28.

The gate electrode of each TFT portion 21 is connected to a gate line 22 and each gate line 22 is connected to a gate driver 29. One signal electrode of each TFT portion 21 is connected to a signal line 23, and each signal line 23 to a signal processing circuit 30. A voltage V for widening the depletion layer is applied to the monocrystalline semiconductor substrate 1, as described above, and X-rays absorbed in each sensor portion 7 are converted to electrons to be stored in the corresponding capacitor portion 20. The gate line 22 of each TFT portion 21 is then driven by the gate driver 29 and the electrons thus stored are transferred through the signal line 23 to the signal processing circuit 30.

Since the configuration of the present embodiment employs the conductive adhesive at every pixel, it becomes feasible to maintain excellent, electrical insulation between adjacent pixels. Since the passivation layer of SiN or the like is provided on the side of the semiconductor substrate bonded to the insulating substrate, it also becomes feasible to maintain excellent, electrical insulation between adjacent pixels even in the high-definition radiation detecting apparatus and the like.

(Embodiment 2)

Figure 4:
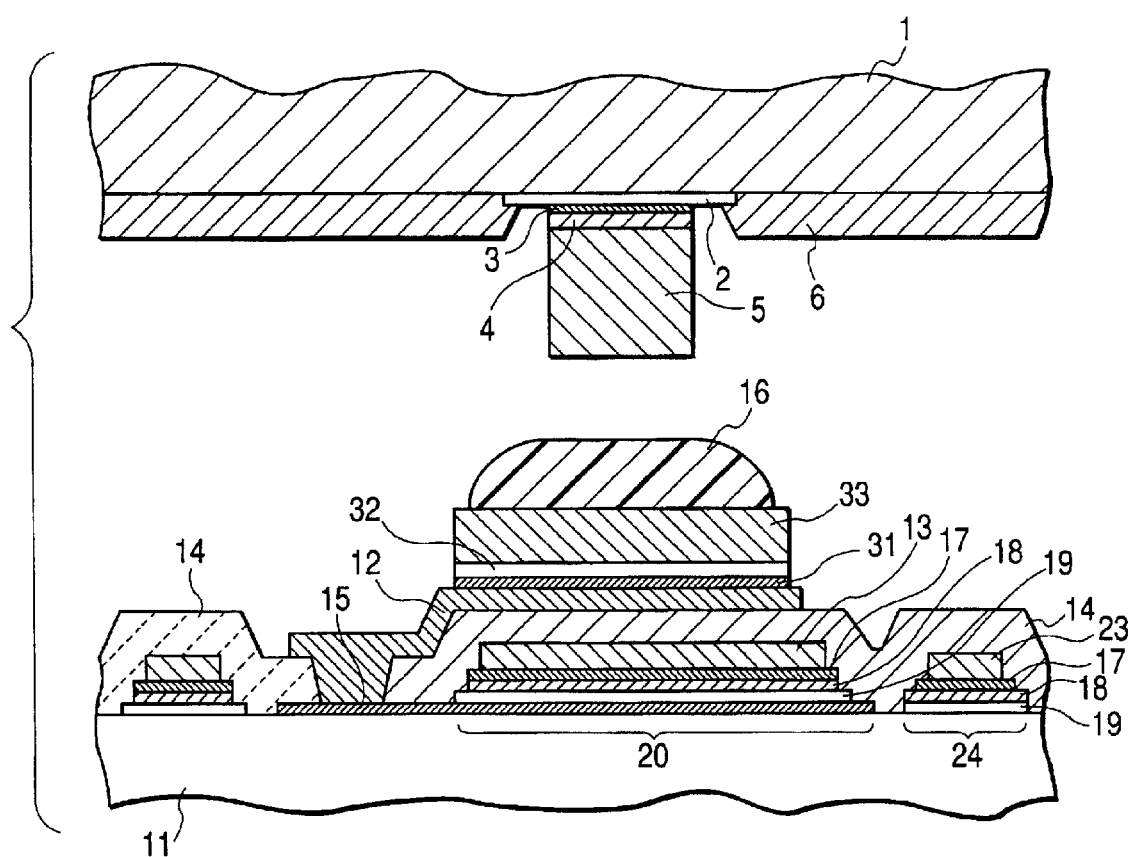
FIG. 4 is a schematic, cross-sectional view of one pixel in the X-ray detecting apparatus of Embodiment 2 before bonding single crystalline substrate with an insulating substrate.

The second embodiment of the present invention will be described below. FIG. 4 is a cross-sectional view showing a configuration of one pixel in the second embodiment. FIG. 4 also shows a cross section where the patterned pixel (sensor portion) on the monocrystalline semiconductor substrate 1 is connected to the capacitor portion 20 of the pixel formed on the insulating substrate 11 through electroconductive adhesive 16. In FIG. 4 identical portions to those in FIG. 1 are denoted by the same reference symbols.

The present embodiment is different from the first embodiment in that barrier metals 31, 32 are deposited on the connection metal 12 formed above the capacitor portion 20 on the insulating substrate 11 and a bump metal 33 is further formed in a projecting state thereon. This configuration permits securer, electrical connection at every pixel. The present embodiment is also different in that a reset TFT portion is provided in each pixel as described hereinafter. The connection metal 12 on the insulating substrate 11 side is also an Al film deposited by sputtering, as in the first embodiment. The thickness of the Al film is 1.0 μm. The connection metal film 12 may also be deposited by resistance heating evaporation, electron beam evaporation, or the like. The material of the connection metal 12 may be either one selected from chromium, molybdenum, tantalum, titanium, copper, etc., as well as Al.

The barrier metal 31 is Ti and the barrier metal 32 Pd, and they are deposited by sputtering. The bump metal 33 is Au and is deposited by electroplating. The thickness of the barrier metal (Ti film) 31 is 0.3 μm, the thickness of the barrier metal (Pd film) 32 0.2 μm, and the thickness of the bump metal (Au film) 33 15 μm. They are formed by first patterning the Au film by photolithography and thereafter successively etching the Pd and Ti films, using the Au film as a mask.

The barrier metals 31, 32 are deposited in order to achieve good adhesion and electrical conduction to the connection metal 12 and to the bump metal 33, respectively, as in the case of the barrier metals 3, 4 in the first embodiment. The other structure is much the same as that in FIG. 1.

A method of electrically connecting the monocrystalline semiconductor substrate 1 to the insulating substrate 11 with the conductive adhesive 16 can also be implemented by use of the method similar to that in the first embodiment. Namely, the electroconductive adhesive 16 is one in which silver particles of 5 to 40 µm are dispersed in a thermosetting epoxy or acrylic adhesive, and is printed by printing on at least one of the bump metal 5 and the bump metal 33 at every pixel. The silver particles may be replaced by particles of copper, carbon, or the like.

Next, the pressing process under high pressure is used for establishing the electrical connection between the bump metals 5 and 33 on the two substrates, and on this occasion, in order to establish uniform electrical junction within the substrates, the conductive adhesive 16 is squeezed 30 to 80% heightwise, thereby reducing the influence of height variations occurring during the printing of the conductive adhesive 16. For the connection between the substrate 1 and the substrate 11, alignment is first achieved and thereafter the electrical connection is established through processes of contact, pressing, and heat hardening. The pressing work is carried out under the pressure of 2 kg/cm$^2$ by the press machine so as to achieve connection between the pixel components and the heat hardening process is carried out at the temperature of 140° C. for 60 minutes.

Figure 5:
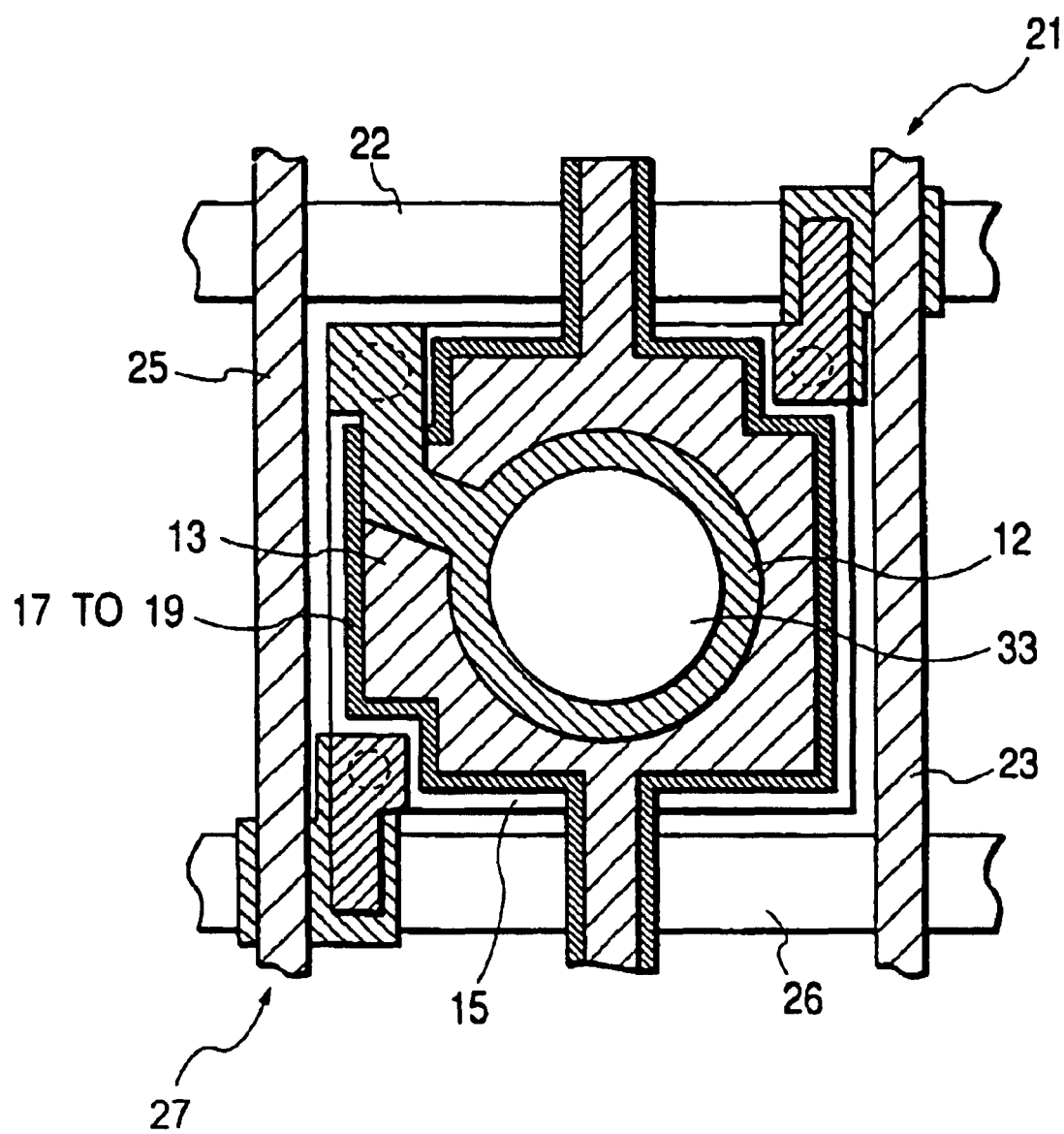
FIG. 5 is a plan view near a capacitor portion 19 on the insulating substrate side in Embodiment 2.

FIG. 5 is a plan view of a pixel including processing portions for processing and control of detected charge, such as the TFT portion 21, TFT portion 24, capacitor portion 20, etc. placed on the insulating substrate 11 side. The size of the pixel is 160 µm square and the connection electrode 12 is placed in the circular shape of φ60 µm and in the center of capacitor portion 20. The bump metal 33 is formed on the connection metal 12 and in highly projecting shape from the substrate. The semiconductor layers of the TFT portion 21 and the TFT portion 24 are comprised of three layers, an insulating film, an i-layer, and an n$^+$ layer, and the capacitor portion 20 is also comprised of films deposited simultaneously with these three layers.

Figure 6:
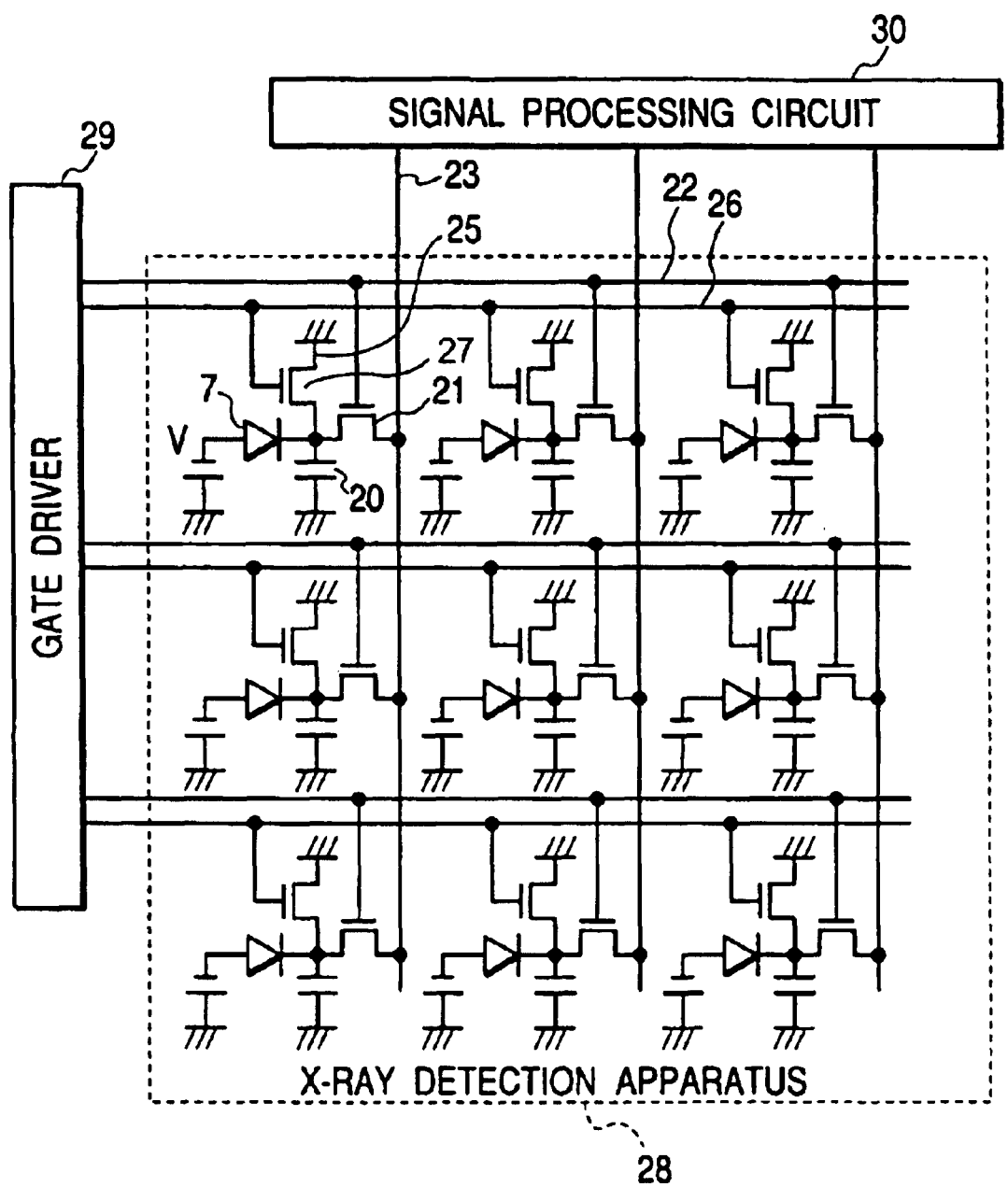
FIG. 6 is a diagram showing an equivalent circuit of the X-ray detecting apparatus 48 in Embodiment 2.

FIG. 6 is a circuit diagram showing an equivalent circuit of the X-ray detecting apparatus in the second embodiment. The X-ray detecting apparatus of the second embodiment is different in provision of reset TFT portions 27 from the apparatus of the first embodiment. The voltage V for widening the depletion region is applied to the semiconductor substrate 1, and electrons generated in each sensor portion 7 are accumulated in the capacitor portion 20 placed on the insulating substrate 11. The electrons thus accumulated are transferred through a signal line 23 to the signal processing circuit 30 by driving the gate line 22 of the TFT portion 21 by the gate driver 29. The apparatus is also configured to control each gate line 26 by the gate driver 29 in similar fashion to drive the TFT portion 27 so as to transfer a reference potential through a reset line 25 to the capacitor portion 20, thereby refreshing the charge in the capacitor portion 20.

In the embodiments described above, the apparatus was described so as to detect X-rays by means of the monocrystalline semiconductor substrate, but the present invention can also be applied to detection of α rays, β rays, γ rays, etc., in addition to X-rays.

By establishing the electrical connection through the electroconductive adhesive at every pixel between the monocrystalline semiconductor substrate serving as a radiation detecting portion and the insulating substrate having the TFT and capacitor portions, the two substrates can be readily connected even in the case of separate production of the semiconductor substrate having the radiation detecting portion and the insulating substrate having the TFT and capacitor portions, which permits implementation of high-sensitivity radiation detecting apparatus easy to produce. Since the connection is effected by providing the projection portion and bump metal at every pixel on the two substrates and placing the electroconductive adhesive at only the pixel portions, it becomes feasible to maintain excellent, electrical insulation between adjacent pixels.

(Embodiment 3)

The present embodiment employs a configuration in which an organic film is provided between pixels in bonded portions of the semiconductor substrate and the substrate provided with TFTs, capacitors, and so on. In the X-ray detecting apparatus, the monocrystalline semiconductor substrate side is produced in sandwich structure wherein the monocrystalline compound semiconductor is placed between the electrode for applying the bias to the monocrystalline compound semiconductor and the electrode for collecting converted carriers, and the TFT matrix panel side is provided with storage capacitors for storing carriers transferred thereto and TFTs for controlling readout of carriers stored in the storage capacitors. The TFT matrix panel side and the monocrystalline semiconductor substrate side are bonded to each other under pressure through metal bump portions and anisotropic conductive films formed by the conductive adhesive. In this structure, however, there is a risk of exposing the protective films etc. for protecting the metal bump portions, TFTs, etc. from the external atmosphere or the like, to the atmosphere, and, depending upon an atmosphere during the bonding, the metal bumps might be corroded, so as to result in degrading durability of wires and electrodes inside the protective films.

With degradation of the durability of wires and electrodes inside the protective films, the metals will be readily corroded in the junction portions at the interface between the TFT matrix panel side and the monocrystalline semiconductor substrate side, for example, if the X-ray detecting apparatus is used under high-temperature and high-humidity conditions, e.g., at the temperature of 30° C. and the humidity of 80%, over long periods.

Figure 7:
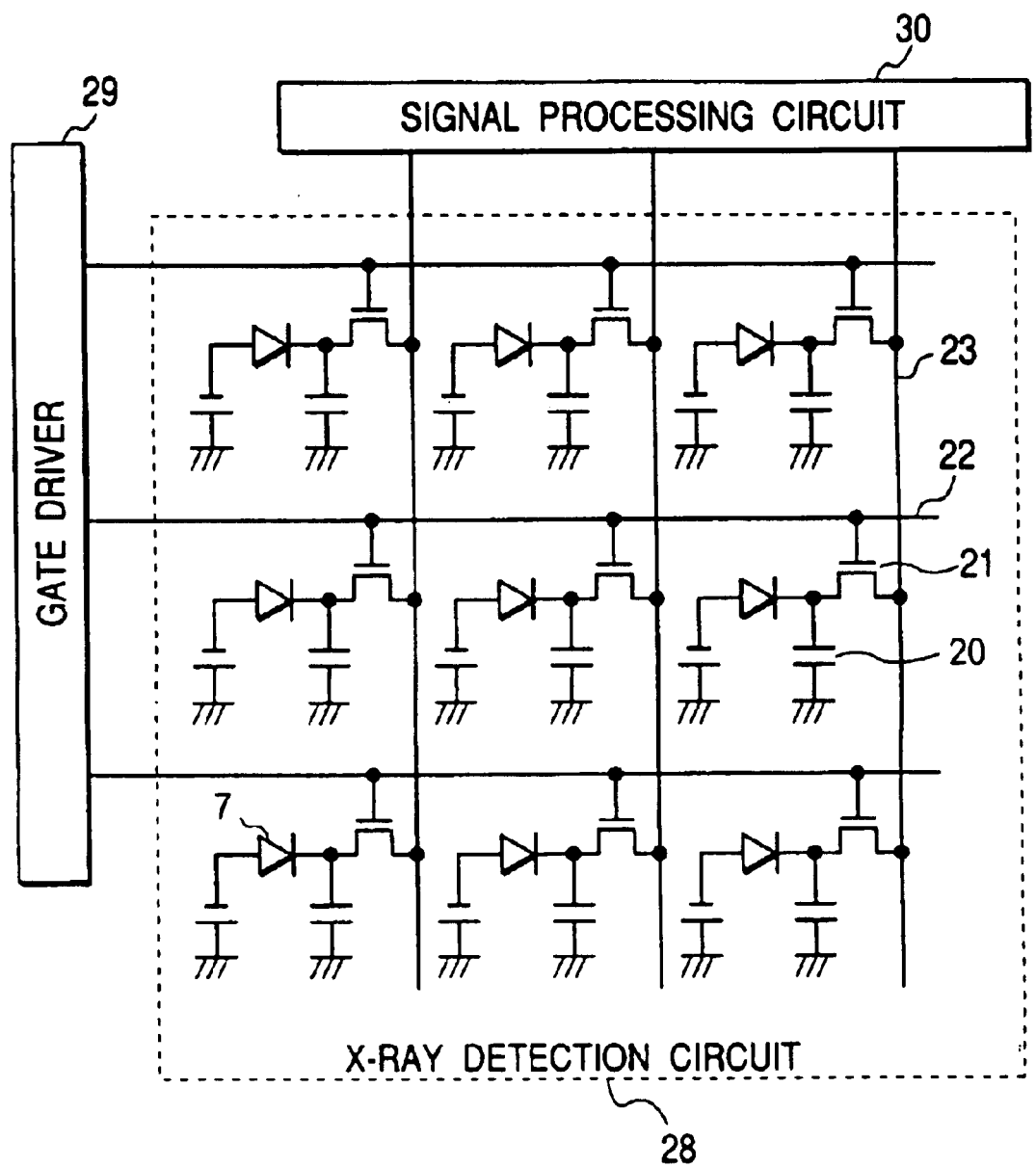
FIG. 7 is a plan view near a bump metal on the monocrystalline semiconductor substrate side in FIG. 4.

This is due to reaction of the metals with water included in the atmosphere and this corrosion will result in failure in electrical conduction. This will result in failure in readout of signals from pixels losing electrical conduction, and, in turn, result in disabling use of the apparatus. There is also a possibility that water directly enters through the protective films to corrode the electrodes on the TFT matrix panel side and damage the capacitances, resulting in defects of pixels. Therefore, the present embodiment employs the configuration in which the organic film is provided at locations where the pixels are not provided in the bonded portions. First, FIG. 7 shows an equivalent circuit of the X-ray detecting apparatus 28 in the present embodiment. Similar members to those in FIG. 3 are denoted by similar reference numerals. As shown in FIG. 7, each X-ray absorbing portion 7, for example, of GaAs, Si, CdTe, CdZnTe, or the like is provided with a power supply for applying the voltage for widening the depletion layer. Then electrons generated in the X-ray absorbing portion 7 are accumulated in a capacitor 20 being a storage means placed on the insulating substrate, and, for reading the accumulated electrons into a signal line 23, a control signal to turn the gate of TFT 21 on is fed from the gate driver 29 to the gate line 22. Then the electrons stored in each capacitor 20 are read through the TFT 21 into the signal line 23 to be transferred to the signal processing circuit 30.

Figure 8:
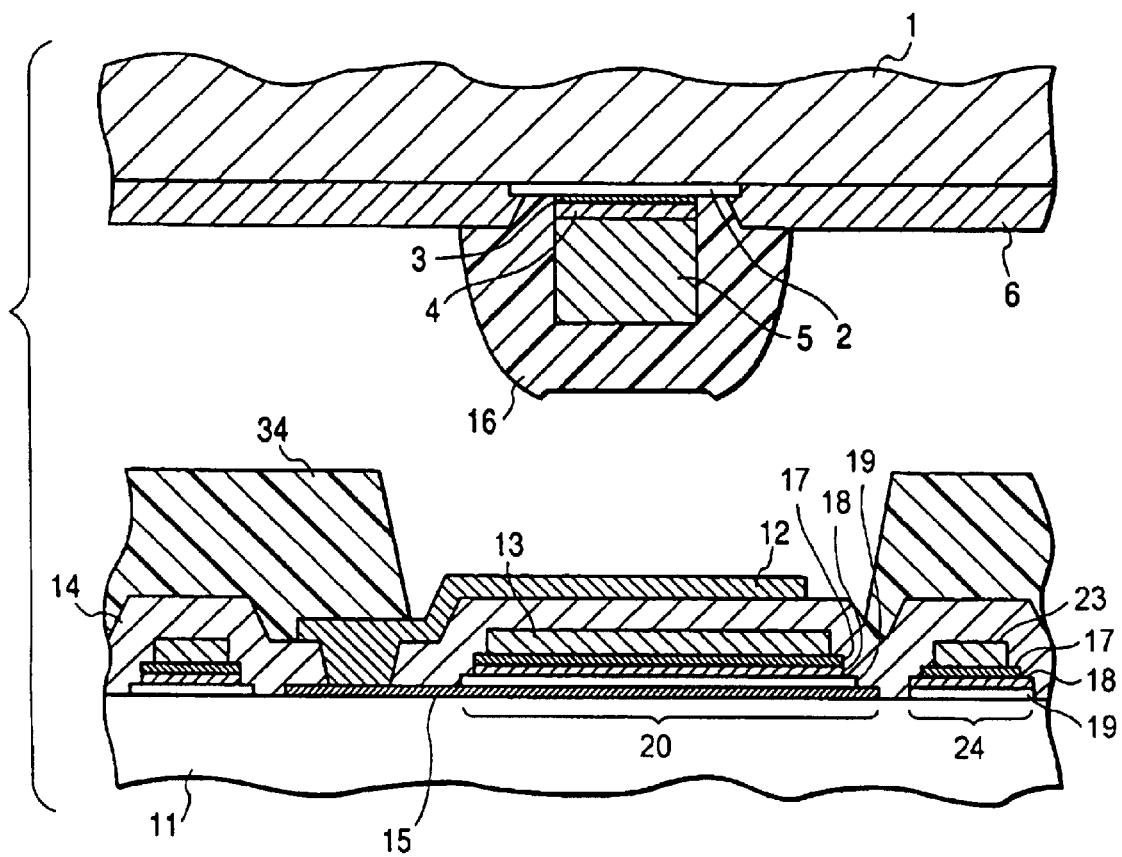
FIG. 8 is a schematic, cross-sectional view showing a configuration in which an organic film is provided on portions without pixels at bonding locations between the substrates in Embodiment 3.
Figure 9:
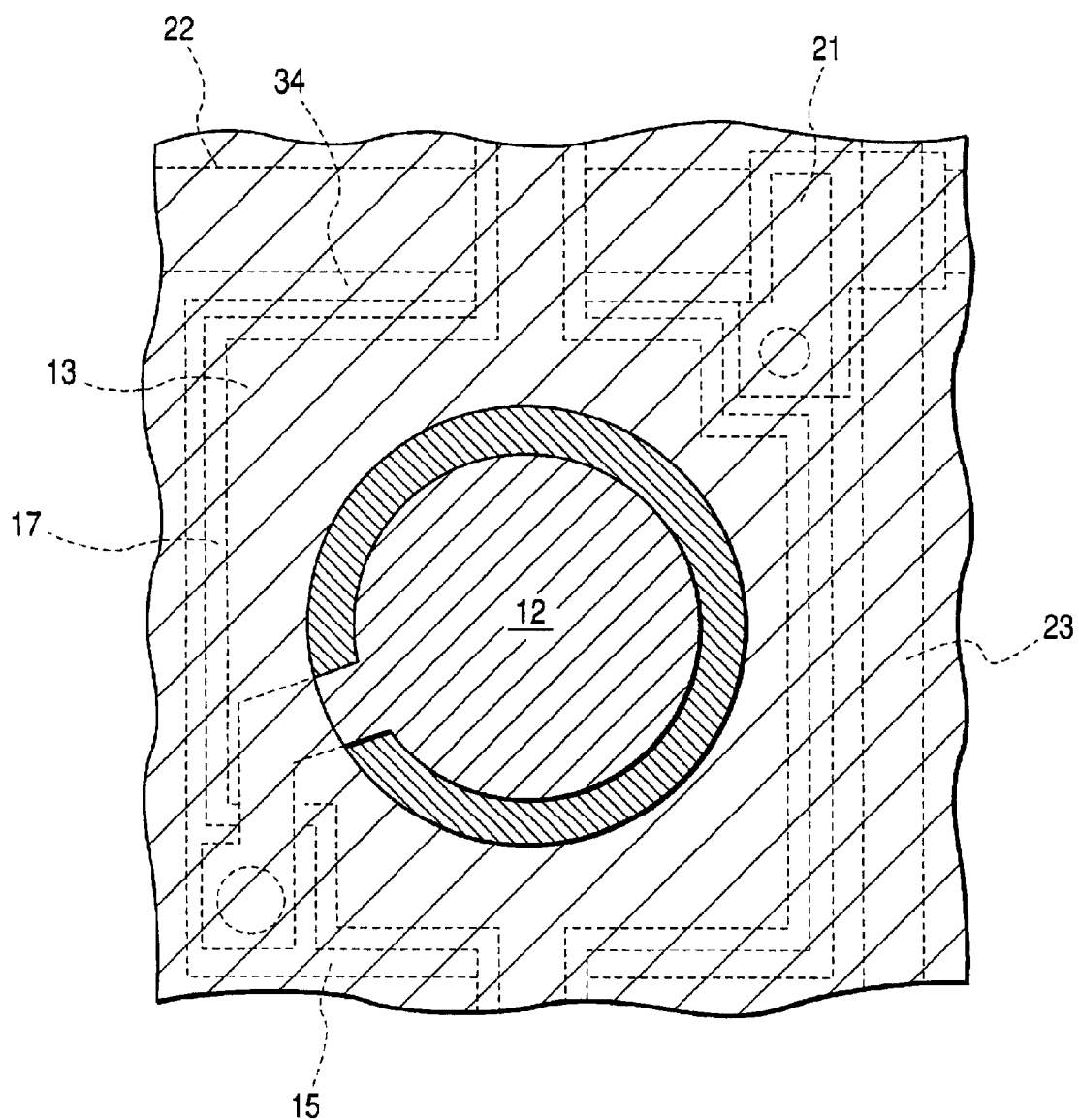
FIG. 9 is a plan view near a capacitor portion 19 of FIG. 8.

FIG. 8 is a schematic, cross-sectional view of one pixel in the X-ray detecting apparatus 28 of FIG. 7, which shows a state before the bonding between the monocrystalline semiconductor substrate 1 side being the first substrate and the insulating substrate 11 side being the second substrate. FIG. 9 is a plan view near a capacitor portion 20 on the insulating substrate 11 side of FIG. 7. The monocrystalline semiconductor substrate 1 is provided with an X-ray absorbing portion 7 and a p-layer and an n-layer are formed on the front surface and on the back surface, respectively. Each of the p-layer and the n-layer is provided with an aluminum film formed thereon and a bias is applied from a power supply to the aluminum films.

X-rays absorbed in the X-ray absorbing portion 7 generate electrons and holes and the connection metal 2 collects the electrons thus generated. The electrons are sent via the barrier metals 3, 4, bump metal 5, and electroconductive adhesive 16 to the connection metal 12 placed on the insulating substrate 11. On the insulating substrate 11 side, the electrons thus transmitted are accumulated in the capacitor 20 and the charge stored is read into the signal line portion 24 including the semiconductor layer consisting of three layers of insulating layer 19, I-layer 18, and n⁺ layer 17, through driving of TFT 21, and the charge thus read is transferred through the signal line 23 to the external signal processing circuit 30.

The connection metal 12 is made of an aluminum film deposited by sputtering or the like. Likewise, the connection metal 12, which is connected to the electrode 15 of the capacitor portion 20 formed on the insulating substrate 11 side and which is placed on the passivation film 14, is also made of an aluminum film deposited by sputtering. The capacitor portion 20 is composed of the TFT 21, and electrodes 13, 15. Formed on the surface of the monocrystalline semiconductor substrate 1 are the passivation film 6 deposited in the thickness of about 1.0 $\mu$m by CVD the connection metal portion (connection metal 2, barrier metals 3, 4, and bump metal 5) patterned by photolithography or the like, as a member for transmitting the charge. The electroconductive adhesive 16 is printed by printing of a thermosetting epoxy adhesive containing silver particles.

The passivation film 14 is also deposited on the insulating substrate 11 and, further, the organic film 34 of a photosensitive polyimide or resist material or the like is applied onto the passivation film 14 or onto the connection metal 12, for example, by a spin coater. After that, the coating thus applied is removed from above and about 20 $\mu$m around the capacitor portion 20 by photolithography or the like.

For the connection between the monocrystalline semiconductor substrate 1 side and the insulating substrate 11 side, alignment is first achieved between them and thereafter they are pressed against each other in a contact state. Then the adhesive is thermally hardened, thereby establishing the electrical connection. The pressing work is carried out, for example, under the pressure of 5.0 kg/cm² by the press machine to establish connection between the pixel components and, at the same time as it, bring the polyimide surface formed on the insulating substrate 11 side into intimate contact with the passivation film formed on the surface of the monocrystalline semiconductor substrate 1. This permits good connection to be established on the occasion of bonding the semiconductor substrate to the matrix panel, and decreases pixels failing to establish electrical connection, for example, due to inclination of the substrate during the bonding, thus enabling good, electrical connection to be established for all the pixels. If the semiconductor substrate is connected at a certain inclination and even if electrical connection is established for all the pixels, there will appear variations in thickness for incidence of radiations of the semiconductor layer for converting radiations to charge, thus posing a problem. The structure of the present embodiment can also solve this problem. It is also necessary to ensure electrical insulation for maintaining the electrical insulation between adjacent pixels. In the present embodiment there is the organic film provided, but it may be replaced, for example, by an inorganic material of silicon nitride film or the like, which is interposed as a spacer. However, particularly, nitride films are very hard films, and thus can undergo cracking of film upon pressing. Use of organic film is more preferable in that films with some elasticity demonstrate better adhesion upon pressing and in that the organic films possess adhesiveness when heated. It is, however, noted that it is necessary to interpose an electrically insulating film. This is for maintaining the electrical insulation between adjacent pixels. According to the configuration of the present embodiment, the passivation films can be omitted if the electrical insulation between adjacent pixels is fully ensured by the organic film 35.

During the heat hardening of the adhesive, it is heated, for example, at the temperature of 140° C. for 60 minutes.

In the present embodiment, the barrier metal 3 is a titanium (Ti) film having the thickness of about 0.3 $\mu$m, and the barrier metal 4 a lead (Pb) film having the thickness of about 0.2 $\mu$m. These films are deposited by sputtering or the like. The bump metal 5 is a film of gold (Au) having the thickness of about 15 $\mu$m.

Further, the thickness from the surface of the passivation film 6 to the surface on the insulating substrate 11 side of the bump metal 5 is, for example, 14.5 $\mu$m, and the thickness between the surface on the insulating substrate 11 side of the bump metal 5 and the surface on the insulating substrate 11 side of the conductive adhesive 16 is, for example, 15 $\mu$m. On the insulating substrate 11 side, the thickness of the connection metal 12 on the passivation film 14 is 1.0 $\mu$m.

Since the insulating substrate 11 side and the monocrystalline semiconductor substrate 1 side need to be electrically connected to each other upon the bonding between them, the thickness of the organic film 34 is determined within a certain range. Namely, a necessary and sufficient condition for the thickness of the organic film 34 is that the organic film 34 is formed between the passivation films 6, 14 when the insulating substrate 11 side and the monocrystalline semiconductor substrate 1 side are bonded to each other in the absence of the organic film 34.

When the thicknesses of the bump metal 5 and others are defined as described above, the thickness of the organic film 34 (the thickness from the passivation film 14 to the surface of the organic film 34 on the monocrystalline semiconductor substrate 1 side) T needs to be determined in the following range:

$$15.5\ \mu m \leq T \leq 30.5\ \mu m.$$

In the present embodiment the thickness T is, for example, 25 $\mu$m.

The thickness T of the organic film is also preferably determined as follows in order to enhance the adhesion; the thickness T satisfies the condition of $t1 \leq T \leq t1+t2$ where $t1$ is the thickness of the transfer member and $t2$ the thickness of the conductive adhesive; and the thickness T further satisfies the condition of $T=(t1-\Delta t1)+(t2-\Delta t2)$ where $\Delta t1$ is a change rate of the thickness of the transfer member upon the bonding between the first substrate and the second substrate and $\Delta t2$ a change rate of the thickness of the conductive adhesive thereupon.

Further, the size of the pixel having the TFT 21 and the capacitor is, for example, 160 $\mu m^2$ and the connection metal 12 is placed, for example, in the circular shape of $\phi$60 $\mu m$ and in the center of the electrode 13. Each of the TFT 21 and capacitor portion 20 is comprised of three layers, an insulating layer 19, an i-layer 18, and an n$^+$ layer 17. Connected to the TFT 21 are a gate line 22 for transmitting a control signal for controlling on/off of the gate, and a signal line 23 for transmitting carriers read out upon activation of the gate.

(Embodiment 4)

Figure 10:
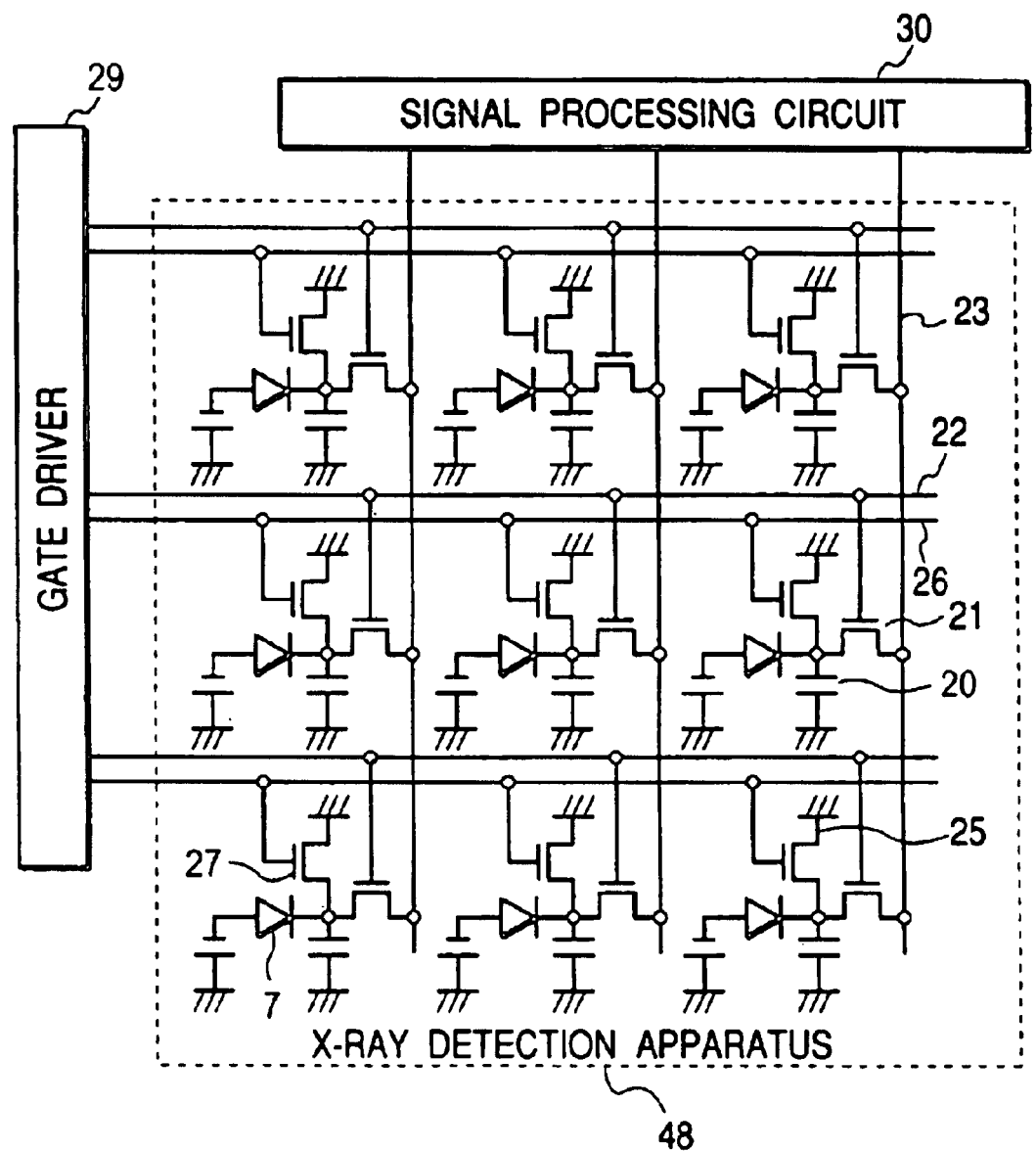
FIG. 10 is a diagram showing an equivalent circuit of the X-ray detecting apparatus 48 in an embodiment of the present invention.

FIG. 10 shows an equivalent circuit of the X-ray detecting apparatus 48 in the present embodiment. In FIG. 10 portions similar to those in FIG. 3 are denoted by the same reference symbols. In the present embodiment the apparatus is provided with a reset means consisting of TFTs 27, reset lines 25, etc., mainly, for resetting electrons left in the capacitors 20 without being read out, after electrons once stored in the capacitors 20 are read out into the corresponding signal lines 23. The TFTs 27 are connected through gate line 26 to the gate driver 29.

FIG. 10 shows the configuration in which each TFT 27 is grounded through the reset line 25, but it may also be connected to a power supply for keeping the capacitor 20 at a fixed potential, instead of the ground.

Figure 11:
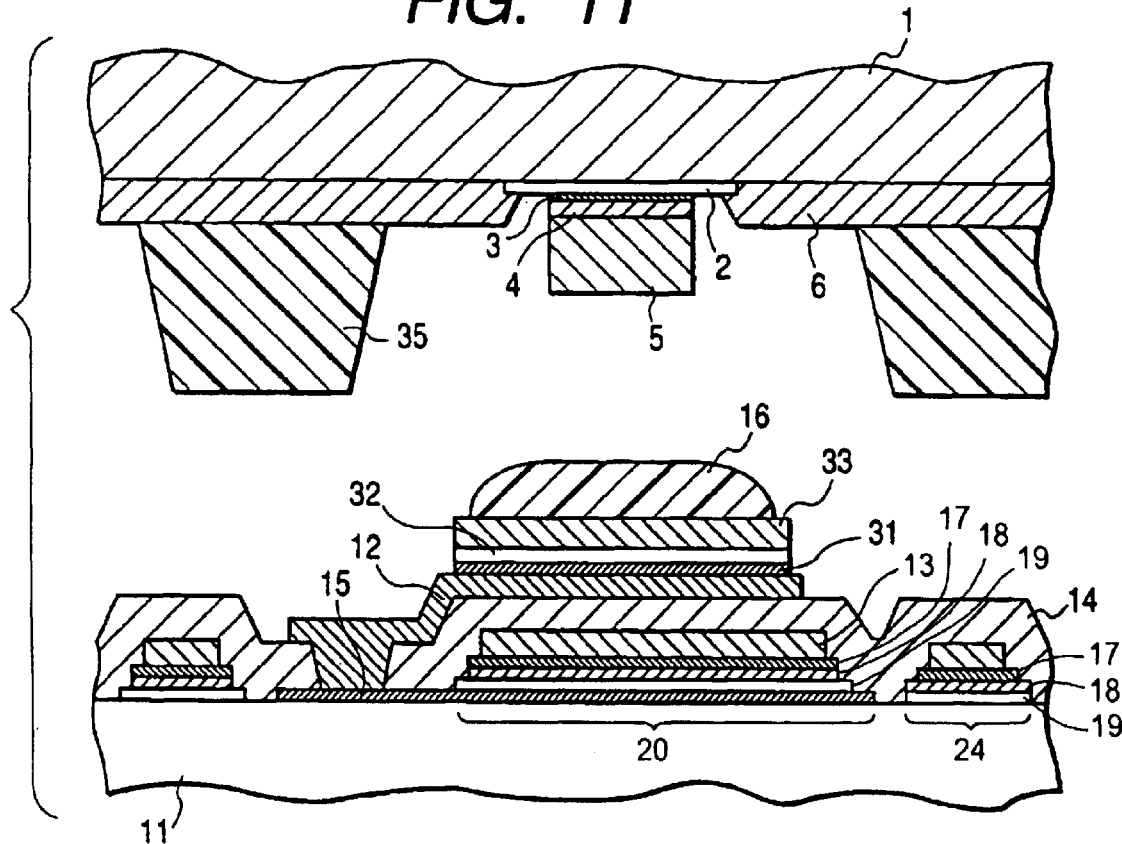
FIG. 11 is a schematic, cross-sectional view of one pixel in the X-ray detecting apparatus of FIG. 10 before bonding a single crystalline substrate with an insulating substrate.
Figure 12:
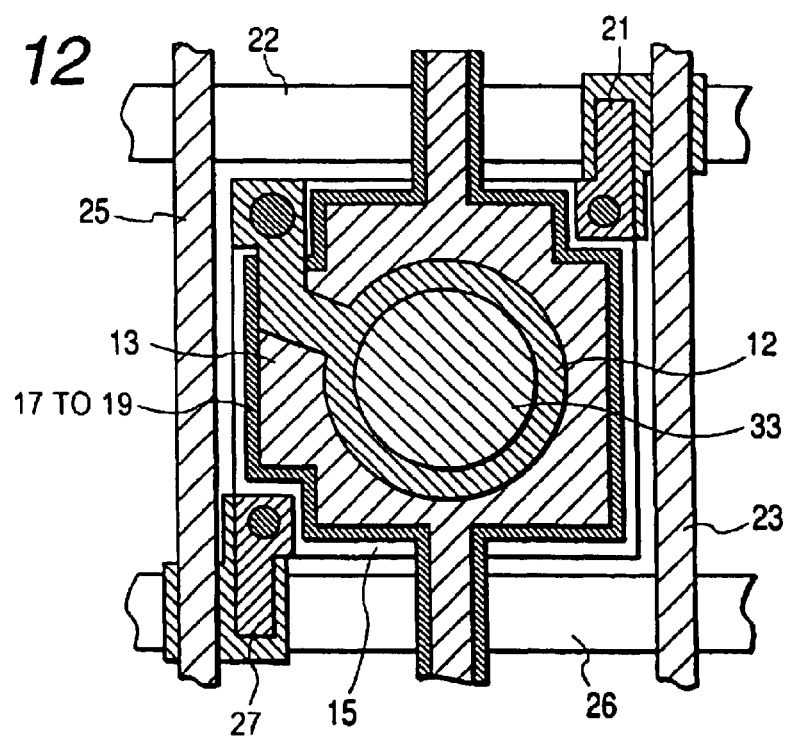
FIG. 12 is a plan view near a capacitor portion 19 on the insulating substrate side in FIG. 10.
Figure 13:
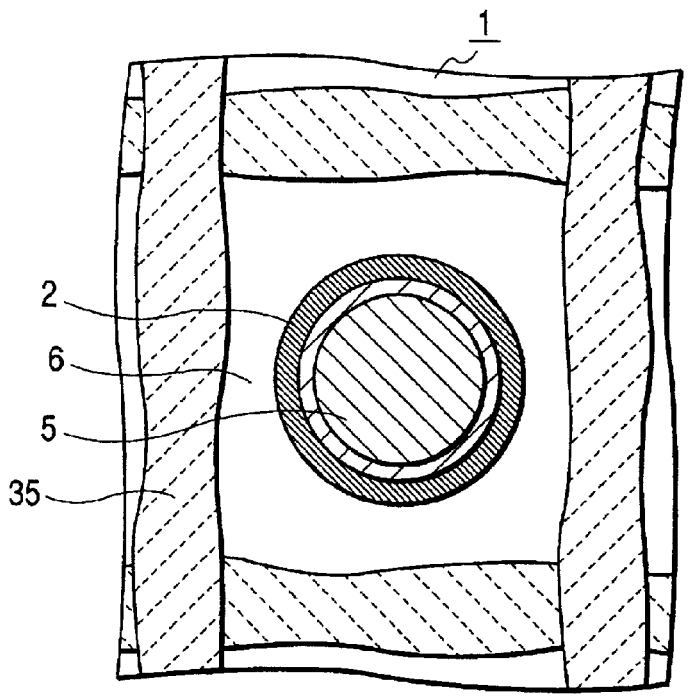
FIG. 13 is a plan view near a bump metal on the monocrystalline semiconductor substrate side in FIG. 10.

FIG. 11 is a schematic, cross-sectional view of one pixel in the X-ray detecting apparatus 48 of FIG. 10, which is an equivalent of FIG. 4. FIG. 12 is a plan view near a capacitor portion 20 on the insulating substrate 11 side, which is an equivalent of FIG. 9. FIG. 13 is a plan view near a bump metal 5 on the monocrystalline semiconductor substrate 1 side in FIG. 10. In FIGS. 11 and 12, similar portions to those in FIGS. 8 and 9 are denoted by the same reference symbols. In the present embodiment the organic film 35 of polymer or the like is formed on the monocrystalline semiconductor substrate 1 side.

On the insulating substrate 11 side, the barrier metals 31, 32, bump metal 33, and electroconductive adhesive 16 are formed on the connection metal 12. The electroconductive adhesive 16 is printed by printing or the like.

On the monocrystalline semiconductor substrate 1 side, the organic film 35 is formed on the passivation film 6. The organic film 35 is an electrically insulating, silicone, acrylic, phenolic, or epoxy resin, which has, for example, the volume resistivity of not less than $1.0 \times 10^{12}$ $\Omega \cdot cm$ and which is formed in a grid pattern by printing or the like. The width of the grid pattern is about 40 to 60 $\mu m$ and the grid pattern is formed by multiple printing processes with a mesh plate.

The monocrystalline semiconductor substrate 1 and insulating substrate 11 are electrically connected to each other through much the same processes as in Embodiment 1, wherein the pressing work is performed, for example, under the pressure of 10.0 kg/cm$^2$ to establish connection between the pixel components and, at the same time as it, bring the surface of the organic film 35 formed on the monocrystalline semiconductor substrate 1 side, into intimate contact with the passivation film 14. This enables implementation of height adjustment.

In the present embodiment, the barrier metal 31 is made of Ti in the thickness of about 0.3 $\mu m$ and the barrier metal 33 of Pb in the thickness of about 0.2 $\mu m$, and these are deposited by sputtering or the like. The bump metals 5, 33 are made of Au in the thickness of about 5 $\mu m$.

The reason why the bump metals 5, 33 are made thin is that during printing of the organic film 35 by printing the bump metal 5 is prevented from exhibiting a great resistance to the printing plate so as to promote wear of the printing plate and increase dispersion of shape of printed pattern. For this reason, supposing that the thickness from the surface of the passivation film 6 to the surface of the bump metal on the insulating substrate 11 side is, for example, 4.5 $\mu m$, the thickness from the surface of the passivation film 14 to the surface of the bump metal 33 on the monocrystalline semiconductor substrate 1 side is, for example, 1.5 $\mu m$, and the thickness of the conductive adhesive 16 is 15 $\mu m$, the thickness T of the organic film 35 needs to satisfy the condition of 11 $\mu m \leq T \leq 26$ $\mu m$. In the present embodiment, the thickness T is, for example, 20 $\mu m$.

(Embodiment 5)

Figure 14:
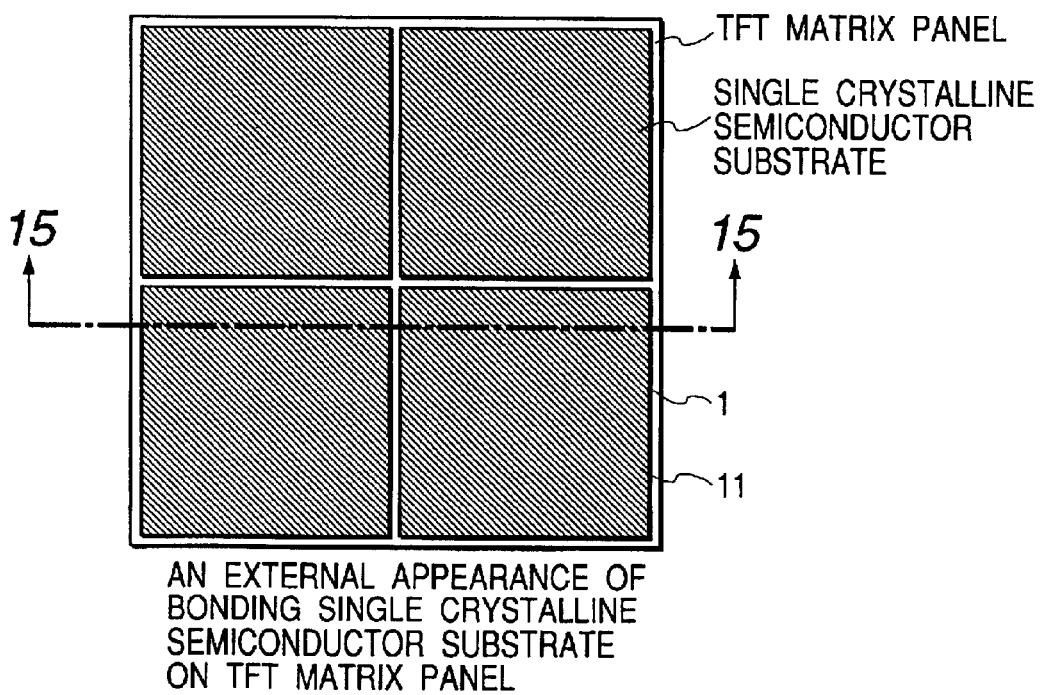
FIG. 14 is a plan view of a radiation detecting apparatus in Embodiment 5.

FIG. 14 is a schematic diagram to show the appearance of a sensor panel which is the X-ray detecting apparatus of the present embodiment and in which a monocrystalline semiconductor substrate is bonded to a TFT matrix panel with TFT matrix devices on an insulating substrate.

In FIG. 14, one sensor panel is formed by bonding four monocrystalline semiconductor substrates to a single TFT matrix panel 11. The reason for this is as follows: the TFT matrix panel made of amorphous silicon on the insulating substrate can be industrially produced using a large substrate and can be freely selected in sizes of about 300 to 1000 (mm) square, whereas it is difficult to make the monocrystalline semiconductor substrates in large sizes; for example, about 12 inches in the case of monocrystalline silicon substrates and about 4 inches in the case of monocrystalline GaAs substrates.

The sensor has to be constructed in larger size, particularly, when human bodies are photographed for medical purposes by the X-ray photographing apparatus. It is thus necessary to bond a plurality of monocrystalline semiconductor substrates. In FIG. 14 four monocrystalline substrates are bonded, but the bonded structure may be constructed of nine substrates in a matrix of 3×3 or sixteen substrates in a matrix of 4×4. Further, the bonded structure may also be constructed by bonding monocrystalline semiconductor substrates in a matrix of different numbers of vertical and horizontal substrates, e.g., twelve substrates in a matrix of 3×4. The monocrystalline semiconductor substrates do not always have to be square, but rectangular substrates may be combined.

FIG. 15 is a view schematically showing a cross section along line 15—15 of FIG. 14. Portions having functions similar to those in FIG. 8 are denoted by the same reference numerals and the description thereof is omitted herein. Electrodes isolated pixel by pixel are arranged on surfaces of the monocrystalline semiconductor substrates, and three pixels are arranged in the lateral direction on each substrate. On the TFT matrix panel with the TFT matrix devices on the insulating substrate, the devices are arrayed in arrangement of six pixels in the lateral direction.

On the monocrystalline semiconductor substrates, the pixel-isolated electrodes are arrayed in arrangement of six pixels in combination of two substrates, and are electrically connected through an electroconductive adhesive to the devices of six pixels arrayed on the TFT matrix panel. For the bonding between the monocrystalline semiconductor substrates and the TFT matrix panel, the conductive adhesive is one in which silver particles of 5 to 40 $\mu m$ are dispersed in an acrylic adhesive and the viscosity of which is controlled in the range of 50 to 500 (Pa·sec), the adhesive is transferred onto the monocrystalline semiconductor substrates by the printing method, and the monocrystalline semiconductor substrates are bonded to the TFT matrix panel through heating and pressing. The adhesive may also be a silicone, phenolic, or epoxy resin, and the conductive particles may be particles of copper or carbon. The heating temperature is desirably not more than the final heating temperature in the heating process of the TFT matrix panel and, particularly, in the case of thermosetting adhesives, the heating temperature needs to be not less than the hardening temperature of the adhesive. In the present embodiment the heating temperature during the bonding is approximately 100 to 160° C. The pressing pressure is determined depending upon the viscosity of the adhesive, the material of the particles in the adhesive, and the size of particles, and is selected in the pressure range of about 1.0 to 50.0 (kgf/cm$^2$).

The four monocrystalline semiconductor substrates all are first aligned on the TFT matrix panel and thereafter are pressed together at a time, but they may be pressed one by one or they may be bonded by first performing temporary pressing one by one under self-weight or under a low pressure below 1.0 (kgf/cm$^2$) and thereafter performing final pressing under the pressure of about 1.0 to 50.0 (kgf/cm$^2$) simultaneously for all the four substrates.

Since the high pressure of 1.0 to 50.0 (kgf/cm$^2$) is applied during the press bonding, it is usually difficult to control the clearance between the monocrystalline semiconductor substrates and the TFT matrix panel, and, in particular, there would be a level difference between four single crystalline semiconductor substrates bonded. For this reason, since capacitive couplings between the monocrystalline semiconductor substrates and the TFT matrix panel are determined by distances of substrate therefrom, an inclination and step of the substrates bonded would cause capacitance variation. As a result, there might be cases where the dispersion of clearances appears in roentgenographic images. According to the present invention, the organic film 34 is placed around the circumference of the conductive adhesive and this organic film functions as a spacer for controlling the clearances between the monocrystalline semiconductor substrates and the TFT matrix panel, whereby the monocrystalline semiconductor substrates and the TFT matrix panel can be coupled at an identical clearance even in the presence of pressure dispersion within each plane and among panels during the press bonding. And, the dispersion of clearances does not appear in roentgenographic image. In FIG. 15, symbols 1-$a$, 1-$b$, 2-$a$, and 2-$b$ represent clearances between the monocrystalline semiconductor substrates and the TFT matrix panel at ends of each panel where control is particularly difficult within each panel and among panels. Since the clearances are controlled by the thickness of the organic film, it is feasible to decrease the dispersion of clearances 1-$a$, 1-$b$, 2-$a$ and 2-$b$ in FIG. 15. However, if this organic film is absent, there is no spacer for controlling the clearances and, in particular, it is thus difficult to control the clearances corresponding to 1-$a$, 1-$b$, 2-$a$ and 2-$b$ between the substrates.

At the same time, a depression amount of the conductive adhesive by the electrode projecting portion formed of the metal bump can also be adjusted by the thickness of the organic film placed on the surface, which can assure stable connection probabilities. The thickness of the organic film is determined depending upon the size of the conductive particles in the adhesive, an application amount of the adhesive, and the size of the electrodes and is selected in the range of 5 to 40 $\mu$m.

In the present embodiment, as described above, the organic film can meet the functions of height adjustment and the protective film during the bonding in the segmental structure of semiconductor substrates. Since the conductive adhesive is provided only at pixel portions with the insulator between the pixels, it becomes feasible to maintain good, electrical insulation between pixels even with decrease in the pixel pitch for higher definition.

(Embodiment 6)

FIG. 16 is a schematic diagram showing a configuration of an X-ray diagnosis system of the present embodiment. As shown in FIG. 16, the X-ray diagnosis system of the present embodiment is constructed in such structure that X-rays 6060 generated in an X-ray tube 6050 pass through chest 6062 of patient or subject 6061 to enter a converter 6040 with a converting layer mounted in the upper part thereof.

The incident X-rays include information about the inside of the body of patient 6061. In accordance with the incidence of X-rays the converting layer generates electrons and holes to yield electrical information. This information is converted to digital data and the digital data is subjected to image processing in image processor 6070. The resultant image can be observed on display 6080 in a control room.

This information can also be transferred to a remote place through transmission means such as a telephone network 6090 or the like to be displayed on display 6081 in a doctor room located at another place or be stored in a storage means such as an optical disk or the like, thereby permitting a doctor at a remote place to make a diagnosis. It is also possible to record the information on film 6110 by film processor 6100.

In the present embodiment the converting apparatus was described in the application to the X-ray diagnosis system, but it can also be applied to radiographic imaging systems such as nondestructive inspection systems or the like using radiations such as $\alpha$ rays, $\beta$ rays, $\gamma$ rays, etc. except for X-rays.

As described above, since the organic film is formed so as to cover the circumference of the transfer member provided at each pixel between the first and second electrodes, it is feasible to prevent the corrosion of the transfer member and others and prevent the degradation of durability of the wires and electrodes formed on the second substrate.

What is claimed is:

1. A radiation detecting apparatus comprising:
    a plurality of first substrates provided with converting means for converting a radiation into a charge;
    a second substrate provided with processing means for processing the charge;
    a transfer member bonding one of said plurality of first substrates with said second substrate for transferring the charge from said one of said plurality of first substrates to said second substrate; and
    a clearance controlling member disposed between (i) said second substrate and (ii) adjacent ones of said plurality of first substrates.

2. A radiation image pick-up system comprising:
    a radiation detecting apparatus according to claim 1;
    signal processing means for processing a signal from said radiation detecting apparatus;
    recording means for recording a signal from said signal processing means;
    displaying means for displaying the signal from said signal processing means;
    transfer processing means for transferring the signal from said signal processing means; and
    a radiation generating source for generating radiation.

3. A radiation detecting apparatus according to claim 1, wherein said clearance controlling member is an insulating film.

4. A radiation detecting apparatus according to claim 1, wherein said clearance controlling member contacts said plurality of first substrates in the same plane.

5. A radiation detecting apparatus according to claim 1, wherein said clearance controlling member is disposed at a periphery of said transfer member, and closely contacts at least a part of said one of said plurality of first substrates and at least a part of said second substrate.

6. A radiation detecting apparatus according to claim 1, wherein said one of said plurality of first substrates is provided with a first passivation film and said second substrate is provided with a second passivation film, and wherein said clearance controlling member closely contacts at least a part of said first passivation film and at least a part of said second passivation film.

7. A radiation detecting apparatus according to claim 1, wherein said clearance controlling member is an organic film.

8. A radiation detecting apparatus according to claim 7, wherein said organic film is formed from a photosensitive polyimide or a resist material.

9. A radiation detecting apparatus according to claim 1, wherein said transfer member is provided in plurality, said plurality of transfer members corresponding to a plurality of pixels of said second substrate, and wherein each of said plurality of pixels comprises storage means for storing charge transferred through one of said plurality of transfer members and control means for controlling reading of the charge stored in said storage means.

10. A radiation detecting apparatus according to claim 1, wherein said transfer member comprises a metallic bump and an electroconductive adhesive.

11. A radiation detecting system comprising:

a radiation detecting apparatus according to claim 1;

signal processing means for processing a signal from said radiation detecting apparatus;

signal recording means for recording a signal from said signal processing means;

displaying means for displaying the signal from said signal processing means;

transfer processing means for transferring the signal from said signal processing means; and a radiation generating source for generating radiation.

* * * * *